(12) United States Patent
Utsunomiya

(10) Patent No.: US 6,660,544 B1
(45) Date of Patent: Dec. 9, 2003

(54) METHOD OF FORMING CONDUCTIVE PATTERNS FORMED IN SEMICONDUCTOR INTEGRATED CIRCUIT DEVICE USING MULTILAYER INTERCONNECTION

(75) Inventor: Masahiko Utsunomiya, Kanagawa (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/287,526

(22) Filed: Nov. 5, 2002

(51) Int. Cl.$^7$ .............................................. H01L 21/66
(52) U.S. Cl. ......................... 438/17; 438/129; 438/599
(58) Field of Search .......................... 438/17, 18, 129, 438/233, 238, 599

(56) References Cited

U.S. PATENT DOCUMENTS 5,671,397 A * 9/1997 Crafts ........................ 438/599
5,858,817 A * 1/1999 Bansal ....................... 438/129
5,923,059 A * 7/1999 Gheewala ................... 257/204
6,323,050 B1 * 11/2001 Dansky et al. ................ 438/17
6,458,644 B1 * 10/2002 Hardee ....................... 438/238

FOREIGN PATENT DOCUMENTS

JP          10-125795        5/1998
JP          2000-243847      9/2000

* cited by examiner

Primary Examiner—Chandra Chaudhari
(74) Attorney, Agent, or Firm—Rabin & Berdo, P.C.

(57) ABSTRACT

A method of forming conductive patterns comprises preparing layout data about macro cells, preparing data about layouts of top-layer conductive pattern metal cells and preparing data about conductive patterns between the macro cells, inputting to the macro cells and outputting from the macro cells. Then measurement-required points of the conductive patterns lying between the macro cells are specified. The top-layer conductive pattern metal cell is interposed in each of the measurement-required points. Finally, layouts of the macro cells and conductive patterns are determined so that layout data is created.

21 Claims, 5 Drawing Sheets

METHOD OF FORMING CONDUCTIVE PATTERNS FORMED IN SEMICONDUCTOR INTEGRATED CIRCUIT DEVICE USING MULTILAYER INTERCONNECTION

BACKGROUND OF THE INVENTION

The present invention relates to a method of manufacturing a semiconductor integrated circuit device, and specifically to a method of laying out conductive patterns employed in a semiconductor integrated circuit device using a multilayer interconnection.

A semiconductor integrated circuit device comprises circuits made up of macro cells, which are utilized in combination. The disposition or arrangement of the macro cells and the layout of conductive patterns lying between the macro cells are determined by a computer system such as CAD, based on layout data. Upon the determination of such a layout, priority is placed on the shortening of the length of each conductive pattern, and a decision as to which layer in a multilayer interconnection should be used, is given a low priority. Incidentally, such a layout method and an automatic layout device have been disclosed in Japanese Patent Application Laid-Open No. Hei 10(1998)-125795.

As described above, top-layer conductive patterns of the multilayer interconnection are often used for connection to electrode pads, and there is a low possibility that the conductive patterns between the macro cells, for example, will be used. Therefore, when it is desired to perform an electrical analysis on internal operating waveforms or the like of a completed semiconductor integrated circuit device, a wiring layer must be peeled and tested, so that it becomes extremely difficult. In the invention disclosed in Japanese Patent Application No. 2000-243847, an empty space unformed with conductive patterns employed in a semiconductor integrated circuit device is utilized to electrically make a connection from a point to be measured at a lower layer of a multilayer interconnection to an observed pad on the uppermost or top-layer conductive pattern through the lower layer to its upper layer with a view toward solving such a problem. Thus, the electrical analysis is allowed from the observed pad.

However, such a method has a possibility that since the empty space is necessary for the conductive patterns employed in the semiconductor integrated circuit device, the semiconductor integrated circuit device will increase in size. There is a need to execute work which takes time and trouble that since the observed pad and an intermediate wiring layer or the like used for its electrical connection are additionally provided after the completion of the layout and wiring employed in the semiconductor integrated circuit device, a parasitic capacitance between adjacent conductive patterns, etc. must be re-calculated.

SUMMARY OF THE INVENTION

The present invention may provide a method of laying out conductive patterns employed in a semiconductor integrated circuit device, which is capable of performing an electrical analysis on internal operating waveforms or the like without peeling a wiring layer.

A method of forming conductive patterns comprises preparing layout data about macro cells, preparing data about layouts of top-layer conductive pattern metal cells and preparing data about conductive patterns between the macro cells, inputting to the macro cells and outputting from the macro cells. Then measurement-required points of the conductive patterns lying between the macro cells are specified. The top-layer conductive pattern metal cell is interposed in each of the measurement-required points. Finally, layouts of the macro cells and conductive patterns are determined so that layout data is created.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
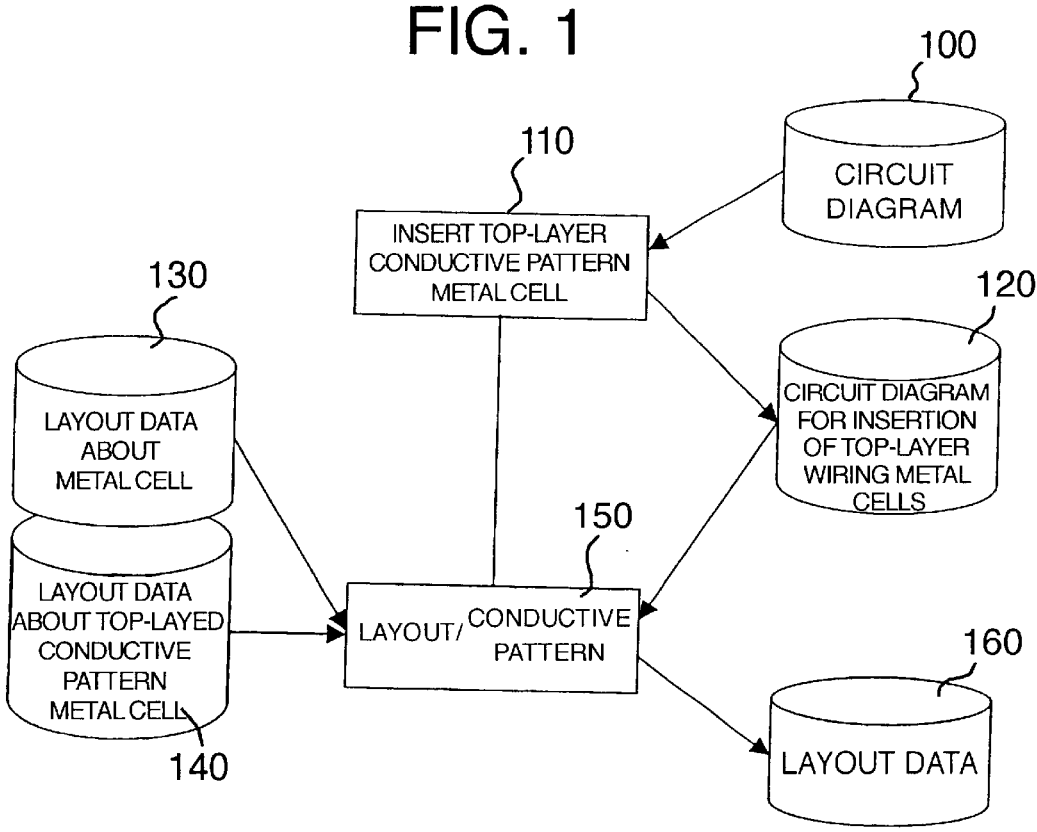
FIG. 1 is a conceptual diagram of a method of laying out conductive patterns employed in a semiconductor integrated circuit device, according to a first embodiment of the present invention.

FIG. 1 is a conceptual diagram showing a method of laying out conductive patterns employed in a semiconductor integrated circuit device, according to a first embodiment of the present invention. The first embodiment of the present invention will be explained below with reference to FIG. 1.

Figure 2:
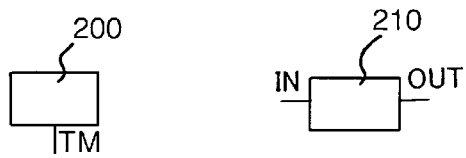
FIG. 2 is a diagram showing circuit symbols of top-layer wiring metal cells.

A top-layer wiring metal cell is first inserted between conductive patterns for macro cells in a circuit diagram 100 of a semiconductor integrated circuit device prior to determination of a layout and wiring (110). The top-layer wiring metal cell used herein indicates one unit of a top-layer conductive pattern. As examples of the top-layer wiring metal cells, may be mentioned, a metal cell 200 with one terminal and a metal cell 210 with two terminals, which are such those as shown in FIG. 2. The metal cell 200 with one terminal is represented as a circuit symbol in the form of a square shape with "TM" from which one line extends out. On the other hand, the metal cell 210 with the two terminals is represented as a circuit symbol in the form of a square shape with "IN and OUT" from which two lines extend out. The metal cells can be handled as data similar to the macro cells.

It is necessary to set in advance the positions where the top-layer wiring metal cells are inserted. The inserting positions are determined with portions desirous of their analysis as the premise. Let's assume that the top-layer wiring metal cells are interposed in conductive patterns among all the macro cells in the first embodiment. Also the top-layer wiring metal cells are regarded as being placed in arbitrary positions of the conductive patterns between the macro cells, and the determination of their positions is made according to the layout of other macro cells, their wiring, etc.

Figure 3:
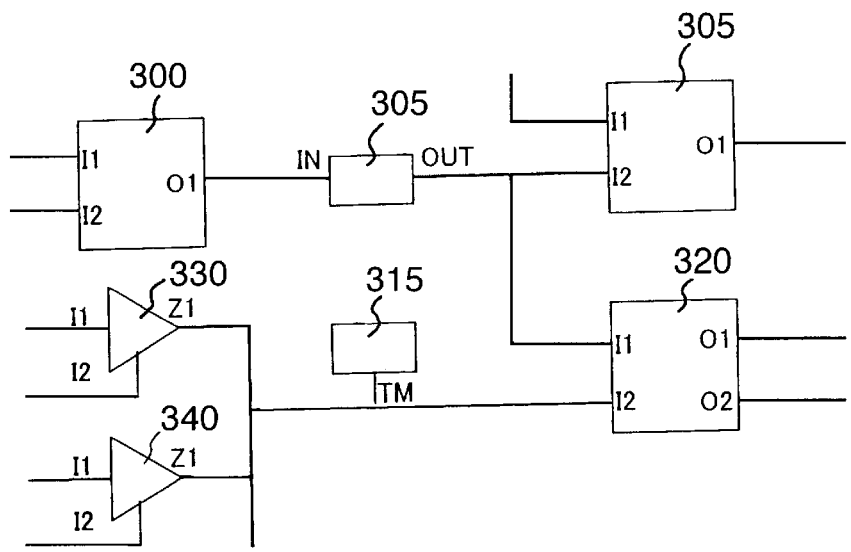
FIG. 3 is an illustrative example of a circuit diagram in which top-layer wiring metal cells are interposed in conductive patterns lying between macro cells.

FIG. 3 shows an illustrative example of a circuit diagram in which top-layer wiring metal cells are interposed in conductive patterns between adjacent macro cells. A metal cell 305 with two terminals is interposed in a conductive pattern between a macro cell 300 and another macro cell 310 or 320. Further, a metal cell 315 with one terminal is interposed in a conductive pattern between macro cells 330 and 340 and a macro cell 320. In the first embodiment of the present invention in this way, each of the top-layer wiring metal cells is interposed in the conductive pattern between the macro cells in one location.

In a circuit diagram 120 in which top-layer wiring metal cells are inserted, a layout and wiring are determined in consideration of layout data 130 about macro cells and layout data 140 about top-layer wiring metal cells (150). Upon the determination of the layout and wiring, a parasitic capacitance between adjacent conductive patterns, and the like are also calculated. When the layout and wiring are determined, layout data 160 about the semiconductor integrated circuit device is completed.

Incidentally, although not illustrated in the drawing, semiconductor integrated circuit devices are designed based on the layout data 160 and formed on a semiconductor wafer. Thereafter, they are separated as individual semiconductor chips from the semiconductor wafer. Each individual semiconductor chip is packaged and completed as the semiconductor integrated circuit device.

According to the method of laying out the conductive patterns employed in the semiconductor integrated circuit device, according to the first embodiment of the present invention, as described above, the top-layer wiring metal cells can be interposed between the macro cells without being given a specific layout/wiring, and an internal electrical analysis can be easily performed.

A method of laying out conductive patterns employed in a semiconductor integrated circuit device, according to a second embodiment of the present invention will next be explained.

Figure 4:
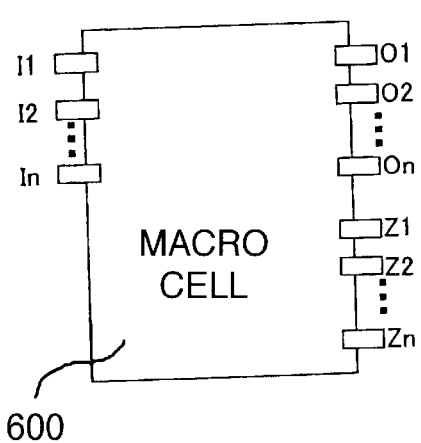
FIG. 4 is a symbolic diagram of a macro cell.

FIG. 4 is a symbol diagram of a macro cell. The macro cell 600 normally has input terminals I1, I2, . . . In, output terminals O1, O2, . . . On, and input/output terminals Z1, Z2, . . . Zn as terminals for input/output. These terminals for the input/output are formed of lower-layer wiring metals. In the method of laying out the conductive patterns employed in the semiconductor integrated circuit device, according to the second embodiment, all of the input/output terminals for the micro cell are connected to their corresponding top-layer wiring metal cells.

Figure 5:
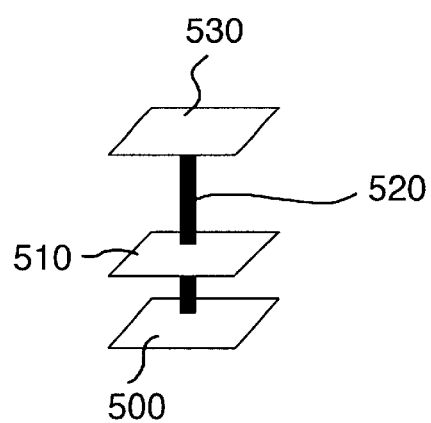
FIG. 5 is a diagram typically showing the manner in which a lower-layer wiring metal is connected toga top-layer metal.

FIG. 5 is a diagram typically showing the manner in which lower-layer wiring metals are connected to a top-layer metal. A lower-layer wiring metal 500 is connected to a top-layer metal 530 via other lower-layer wiring metal 510 and an interlayer connecting metal 520 or the like.

Figure 6:
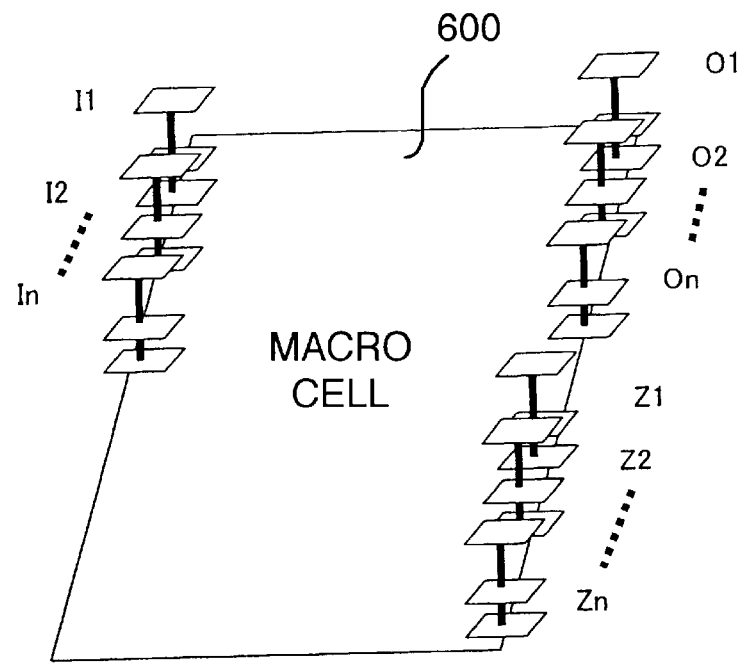
FIG. 6 is a diagram typically illustrating a terminal structure of a macro cell, which is formed by a method of laying out conductive patterns employed in a semiconductor integrated circuit device, according to a second embodiment.

FIG. 6 is a diagram typically showing a terminal structure of a macro cell, which is formed by the method of laying out the conductive patterns employed in the semiconductor integrated circuit device, according to the second embodiment. As is understood from FIG. 6, input terminals i1, I2, . . . In, output terminals 01, 02, . . . On, and input/output terminals Z1, Z2, . . . Zn corresponding to terminals for the input/output of a macro cell 600 are all connected to their corresponding top-layer wiring metal cells.

Figure 7:
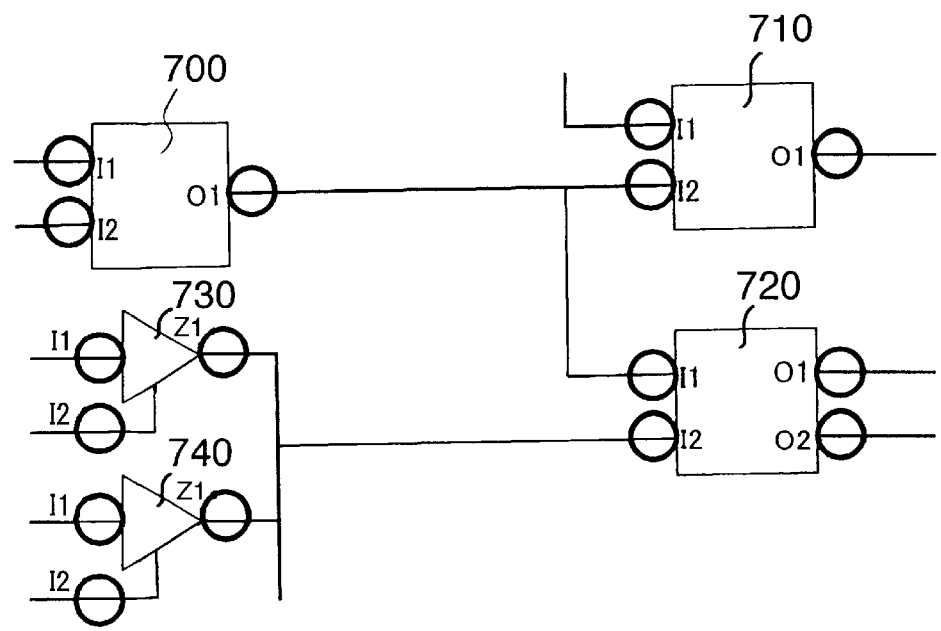
FIG. 7 is an illustrative example of a partial circuit diagram of the semiconductor integrated circuit device, which is formed by the wiring layout method shown in FIG. 6.

FIG. 7 shows an illustrative example of a partial circuit diagram of the semiconductor integrated circuit device, which is formed by the wiring layout method shown in FIG. 6. In FIG. 7, points marked with ○ indicate portions connected to their corresponding top-layer wiring metal cells. As is understood from FIG. 7, input/output terminals of all macro cells 700 to 740 are connected to their corresponding top-layer wiring metal cells.

Since the input/output terminals of all the macro cells can be electrically measured in the second embodiment of the present invention, there is a merit that it is possible to determine whether the conductive pattern between the adjacent macro cells is defective or the interior of each macro cell is defective.

A method of laying out conductive patterns employed in a semiconductor integrated circuit device, according to a third embodiment of the present invention will next be described.

Figure 8:
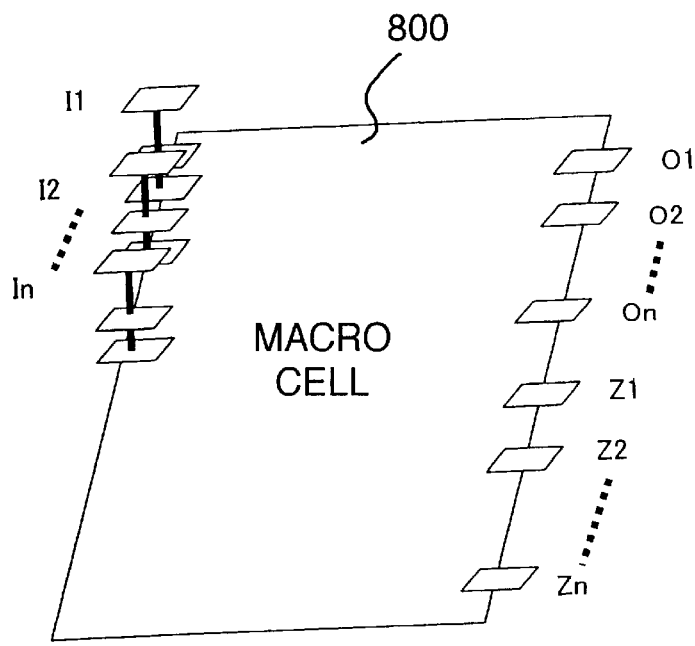
FIG. 8 is a diagram typically showing a terminal structure of a macro cell, which is formed by a method of laying out conductive patterns employed in a semiconductor integrated circuit device, according to a third embodiment.

FIG. 8 is a diagram typically showing a terminal structure of a macro cell, which is formed by the wiring layout method referred to above. As is understood from FIG. 8, input terminals I1, I2, . . . In of the macro cell 800 are all connected to their corresponding top-layer wiring metal cells. On the other hand, output terminals O1, O2, . . . On and input/output terminals Z1, Z2, . . . Zn of the macro cell 800 are not connected to top-layer wiring metal cells. Incidentally, when the macro cell has only the input/output terminals, they are connected to their corresponding top-layer wiring metal cells.

Figure 9:
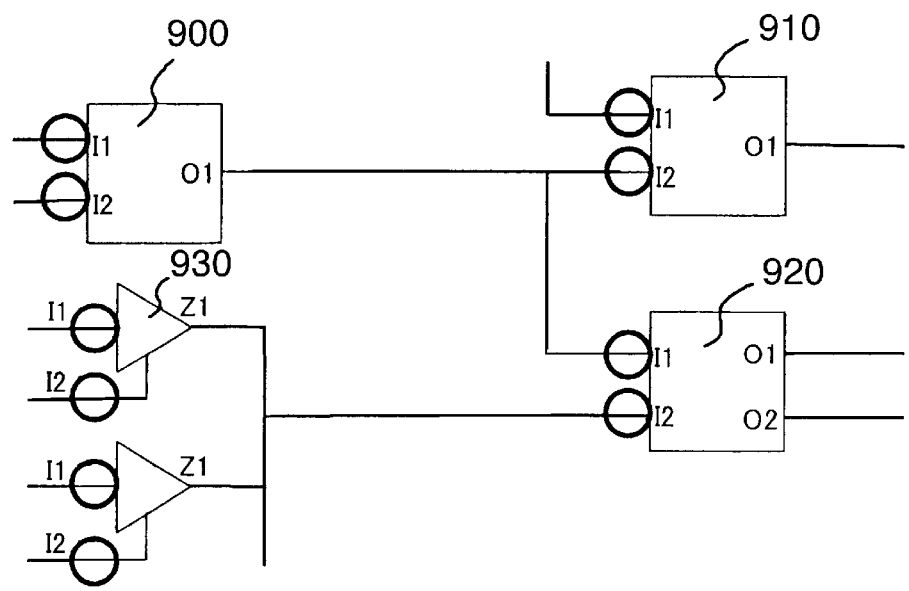
FIG. 9 is an illustrative example of a partial circuit diagram of the semiconductor integrated circuit device, which is formed by the wiring layout method shown in FIG. 8.

FIG. 9 shows an illustrative example of a partial circuit diagram of the semiconductor integrated circuit device, which is formed by the wiring layout method shown in FIG. 8. In a manner similar to FIG. 7 even in FIG. 9, points marked with ○ indicate portions connected to their corresponding top-layer wiring metal cells. As is understood from FIG. 9, input terminals of all macro cells 900 to 940 are connected to their corresponding top-layer wiring metal cells. On the other hand, output terminals and input/output terminals of all the macro cells 900 to 940 are not connected to top-layer wiring metal cells.

The third embodiment has the advantage of improving wiring efficiency as compared with the second embodiment.

A method of laying out conductive patterns employed in a semiconductor integrated circuit device, according to a fourth embodiment of the present invention will next be described.

Figure 10:
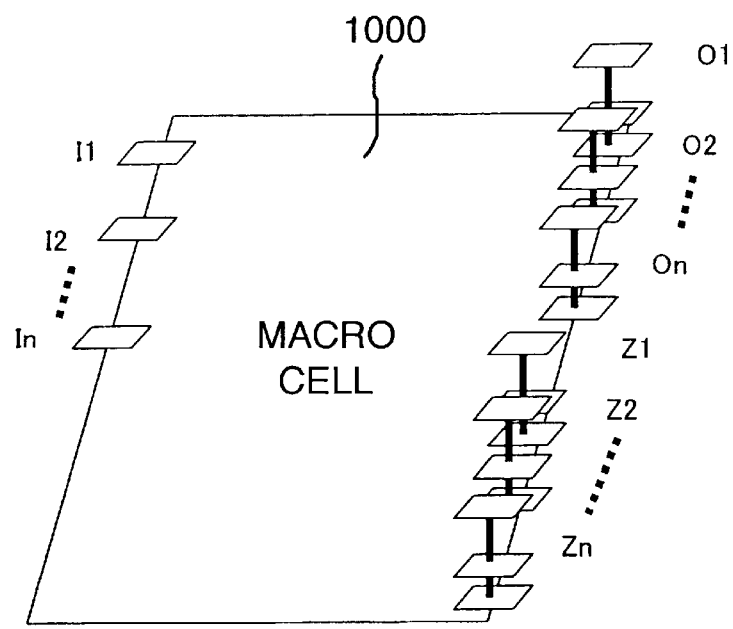
FIG. 10 is a diagram typically depicting a terminal structure of a macro cell, which is formed by the wiring layout method shown in FIG. 8.

FIG. 10 is a diagram typically showing a terminal structure of a macro cell, which is formed by the method of laying out the conductive patterns employed in the semiconductor integrated circuit device, according to the fourth embodiment. As is understood from FIG. 10, output terminals O1, O2, . . . On and input/output terminals Z1, Z2, . . . Zn of a macro cell 1000 are all connected to their corresponding top-layer wiring metal cells. On the other hand, input terminals I1, I2, . . . In of the macro cell 1000 are disconnected from top-layer wiring metal cells. Incidentally, when the macro cell has only the input/output terminals, they are connected to their corresponding top-layer wiring metal cells.

Figure 11:
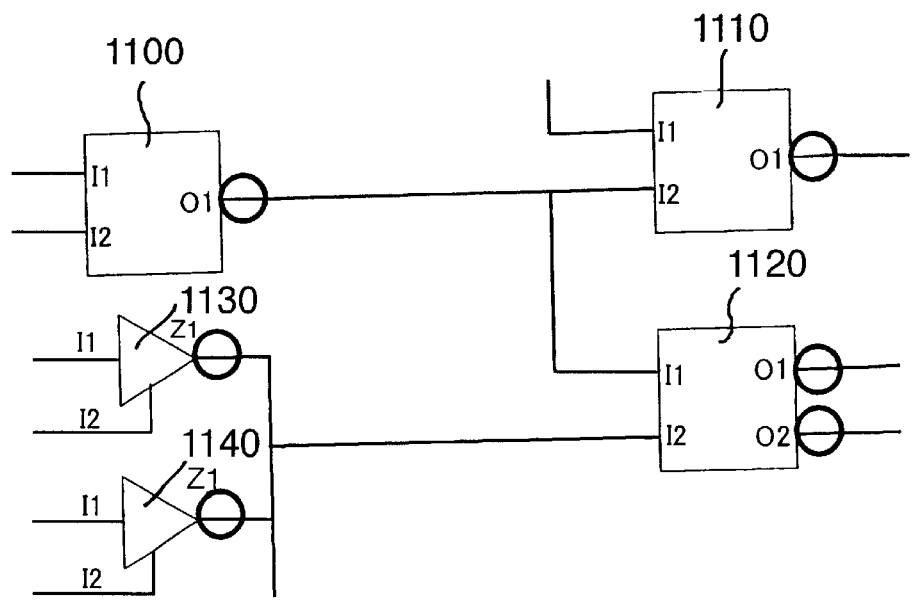
FIG. 11 is an illustrative example of a partial circuit diagram of a semiconductor integrated circuit device, which is formed by a method of laying out conductive patterns employed in the semiconductor integrated circuit device, according to a fourth embodiment.

FIG. 11 shows an illustrative example of a partial circuit diagram of the semiconductor integrated circuit device, which is formed by the wiring layout method shown in FIG. 10. In a manner similar to FIG. 7 even in FIG. 11, points marked with ○ indicate portions connected to their corresponding top-layer wiring metal cells. As is understood from FIG. 11, output terminals and input/output terminals of all macro cells 1100 to 1140 are connected to their corresponding top-layer wiring metal cells. On the other hand, input terminals of all the macro cells 1100 to 1140 are not connected to top-layer wiring metal cells.

The fourth embodiment has the advantage of improving wiring efficiency as compared with the second embodiment in a manner similar to the third embodiment.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming conductive patterns employed in a semiconductor integrated circuit device, comprising:
   preparing layout data about a plurality of macro cells;
   preparing data about layouts of top-layer conductive pattern metal cells;
   preparing data about conductive patterns between the macro cells, inputting to the macro cells and outputting from the macro cells;
   specifying measurement-required points of the conductive patterns lying between the macro cells;
   interposing the top-layer conductive pattern metal cell in each of the measurement-required points; and
   thereafter determining layouts of the macro cells and conductive patterns and thereby creating layout data.

2. The method according to claim 1, wherein the top-layer conductive pattern metal cell layouts have a metal cell layout with only one terminal and a metal cell layout having two terminals.

3. The method according to claim 1, wherein when the layouts and conductive patterns are determined, a parasitic capacitance between the adjacent conductive patterns is also calculated.

4. The method according to claim 1, wherein the measurement-required points are arbitrary points of all the conductive patterns connecting between the macro cells.

5. The method according to claim 1, wherein the measurement-required points are all input terminals and output terminals of all the macro cells.

6. The method according to claim 1, wherein the measurement-required points are all input terminals of all the macro cells.

7. The method according to claim 1, wherein the measurement-required points are all output terminals of all the macro cells.

8. A method of manufacturing a semiconductor integrated circuit device, comprising:
   preparing layout data about a plurality of macro cells;
   preparing data about layouts of top-layer wiring metal cells;
   preparing data about conductive patterns between the macro cells, inputting to the macro cells and outputting from the macro cells;
   specifying measurement-required points of the conductive patterns lying between the macro cells;
   interposing the top-layer conductive pattern metal cell in each of the measurement-required points;
   thereafter determining layouts of the macro cells and conductive patterns and thereby creating layout data; and
   manufacturing the semiconductor integrated circuit device, based on the layout data.

9. The method according to claim 8, wherein the top-layer conductive pattern metal cell layouts have a metal cell layout with only one terminal and a metal cell layout having two terminals.

10. The method according to claim 8, wherein when the layouts and conductive patterns are determined, a parasitic capacitance between the adjacent conductive patterns is also calculated.

11. The method according to claim 8, wherein the measurement-required points are arbitrary points of all the conductive patterns connecting between the macro cells.

12. The method according to claim 8, wherein the measurement-required points are all input terminals and output terminals of all the macro cells.

13. The method according to claim 8, wherein the measurement-required points are all input terminals of all the macro cells.

14. The method according to claim 8, wherein the measurement-required points are all output terminals of all the macro cells.

15. A method of forming conductive patterns employed in a semiconductor integrated circuit device, comprising:
   determining a plurality of macro cells employed in the semiconductor integrated circuit device and conductive patterns placed between the macro cells inputting to the macro cells and outputting from the macro cells and thereby obtaining a tentative circuit diagram;
   specifying measurement-required points of the conductive patterns between the macro cells in the circuit diagram;
   interposing top-layer conductive pattern metal cells in the measurement-required points;
   preparing layout data about the macro cells and data about layouts of the top-layer conductive pattern metal cells; and
   thereafter determining layouts of the macro cells and conductive patterns and thereby creating layout data.

16. The method according to claim 15, wherein the top-layer conductive pattern metal cell layouts have a metal cell layout with only one terminal and a metal cell layout having two terminals.

17. The method according to claim 15, wherein when the layouts and wiring are determined, a parasitic capacitance between the adjacent conductive patterns is also calculated.

18. The method according to claim 15, wherein the measurement-required points are arbitrary points of all the conductive patterns connecting between the macro cells.

19. The method according to claim 15, wherein the measurement-required points are all input terminals and output terminals of all the macro cells.

20. The method according to claim 15, wherein the measurement-required points are all input terminals of all the macro cells.

21. The method according to claim 15, wherein the measurement-required points are all output terminals of all the macro cells.

* * * * *